US 12,238,461 B2

(12) United States Patent
Tian et al.

(10) Patent No.: US 12,238,461 B2
(45) Date of Patent: Feb. 25, 2025

(54) LASER PROJECTION APPARATUS

(71) Applicant: Hisense Laser Display Co., Ltd, Qingdao (CN)

(72) Inventors: Youliang Tian, Qingdao (CN); Zinan Zhou, Qingdao (CN); Xin Zhang, Qingdao (CN); Yunchen Lu, Qingdao (CN)

(73) Assignee: HISENSE LASER DISPLAY CO., LTD, Quangdao (CN)

(*) Notice: Subject to any disclaimer, the term of this patent is extended or adjusted under 35 U.S.C. 154(b) by 375 days.

(21) Appl. No.: 17/943,608

(22) Filed: Sep. 13, 2022

(65) Prior Publication Data

US 2023/0007218 A1 Jan. 5, 2023

Related U.S. Application Data

(63) Continuation of application No. PCT/CN2021/082139, filed on Mar. 22, 2021.

(30) Foreign Application Priority Data

Apr. 21, 2020 (CN) .......................... 202010318957.6

(51) Int. Cl.
  *H04N 9/31* (2006.01)
  *G03B 21/20* (2006.01)

(52) U.S. Cl.
  CPC ....... *H04N 9/3161* (2013.01); *G03B 21/2066* (2013.01); *H04N 9/3167* (2013.01)

(58) Field of Classification Search
  CPC .......................... G03B 21/2066; H04N 99/3167
  (Continued)

(56) References Cited

U.S. PATENT DOCUMENTS 7,097,315 B2   8/2006  Li et al.
10,218,151 B1  2/2019  Hwang et al.
(Continued)

FOREIGN PATENT DOCUMENTS

CN    1534313 A    10/2004
CN  109390843 A     2/2019
(Continued)

OTHER PUBLICATIONS

Translation of CN 109560455 (Year: 2024).*
(Continued)

*Primary Examiner* — Jerry L Brooks
(74) *Attorney, Agent, or Firm* — Morgan, Lewis & Bockius LLP

(57) ABSTRACT

The laser projection apparatus includes a laser source, an optical engine and a projection lens. The laser source includes a base plate, a plurality of light-emitting components and a reflecting portion. The plurality of light-emitting components include a first light-emitting component and a second light-emitting component. The polarization direction of the laser beam emitted by one of the first light-emitting component and the second light-emitting component is parallel to the base plate, and the polarization direction of the laser beam emitted by another of the first light-emitting component and the second light-emitting component is perpendicular to the base plate. The reflecting prism is configured to change a polarization polarity of one of the laser beam with the polarization direction perpendicular to the base plate or the laser beam with the polarization direction parallel to the base plate.

20 Claims, 9 Drawing Sheets

(58) Field of Classification Search
USPC .......................................................... 353/31
See application file for complete search history.

(56) References Cited

U.S. PATENT DOCUMENTS

| | | |
|---|---|---|
| 2013/0010002 A1 | 1/2013 | Takahashi et al. |
| 2013/0272329 A1 | 10/2013 | Auen et al. |
| 2014/0375956 A1 | 12/2014 | Khrushchev |
| 2015/0109680 A1 | 4/2015 | Vorndran et al. |
| 2015/0303648 A1 | 10/2015 | Kozuru et al. |
| 2019/0067913 A1 | 2/2019 | Taji |
| 2019/0094673 A1 | 3/2019 | Tian et al. |

FOREIGN PATENT DOCUMENTS

| | | | | |
|---|---|---|---|---|
| CN | 109560455 A | * | 4/2019 | ............. G02B 27/48 |
| DE | 102012201307 A1 | | 8/2013 | |
| JP | 2011049338 A | | 3/2011 | |
| WO | 2015111145 A1 | | 7/2015 | |

OTHER PUBLICATIONS

International Search Report (PCT/ISA/210) and Written Opinion (PCT/ISA/237) issued in PCT Application No. PCT/CN2021/082139 dated Jun. 23, 2021 with English Translation.
Office Action issued in corresponding Chinese Patent Application No. 202010318957.6 dated Feb. 16, 2022 with English Translation.

* cited by examiner

LASER PROJECTION APPARATUS

CROSS-REFERENCE TO RELATED APPLICATIONS

This application is a continuation application of International Application No. PCT/CN2021/082139, filed on Mar. 22, 2021, which claims priority to Chinese Patent Application No. 202010318957.6, filed on Apr. 21, 2020, which are incorporated herein by reference in their entireties.

TECHNICAL FIELD

The present disclosure relates to the field of laser projection technologies, and in particular, to a laser projection apparatus.

BACKGROUND

With the development of laser projection technologies, laser devices are widely used as laser sources in laser projection apparatus. A laser beam is a monochromatic linearly polarized light. The laser device provides illumination beams for the laser projection apparatus by emitting the laser beams, so that the laser projection apparatus may perform image display.

SUMMARY

A laser projection apparatus is provided. The laser projection apparatus includes a laser source, an optical engine and a projection lens. The laser source is configured to emit illumination beams. The optical engine is configured to modulate the illumination beams emitted by the laser source, so as to obtain projection beams. The projection lens is configured to project the projection beams into an image. The laser source includes a base plate, a plurality of light-emitting components and a reflecting portion. The plurality of light-emitting components are disposed on the base plate and are configured to emit laser beams. The reflecting prism is disposed on the base plate. The reflecting prism corresponds to at least one of the plurality of light-emitting components, and the reflecting prism is located on a laser-exit side of the at least one light-emitting component. The plurality of light-emitting components include a first light-emitting component and a second light-emitting component. A polarization direction of a laser beam emitted by the first light-emitting component and a polarization direction of a laser beam emitted by the second light-emitting component are perpendicular to each other, and a laser-exit direction of the first light-emitting component and a laser-exit direction of the second light-emitting component are perpendicular to each other. The polarization direction of the laser beam emitted by one of the first light-emitting component and the second light-emitting component is parallel to the base plate, and the polarization direction of the laser beam emitted by another of the first light-emitting component and the second light-emitting component is perpendicular to the base plate. The reflecting prism is configured to reflect the laser beams emitted by the light-emitting components in a direction away from the base plate, and change a polarization polarity of one of the laser beam with the polarization direction perpendicular to the base plate or the laser beam with the polarization direction parallel to the base plate, so as to make the polarization directions of the laser beams reflected by the reflecting prism same. The laser beams exiting from the laser source in the direction away from the base plate constitute the illumination beams.

BRIEF DESCRIPTION OF THE DRAWINGS

In order to describe technical solutions in the present disclosure more clearly, the accompanying drawings to be used in some embodiments of the present disclosure will be introduced briefly. However, the accompanying drawings to be described below are merely some embodiments of the present disclosure, and a person of ordinary skill in the art may obtain other drawings according to these drawings. In addition, the accompanying drawings to be described below may be regarded as schematic diagrams, and are not limitations on an actual size of a product, an actual process of a method and an actual timing of a signal to which the embodiments of the present disclosure relate.

DETAILED DESCRIPTION

Figure 1:
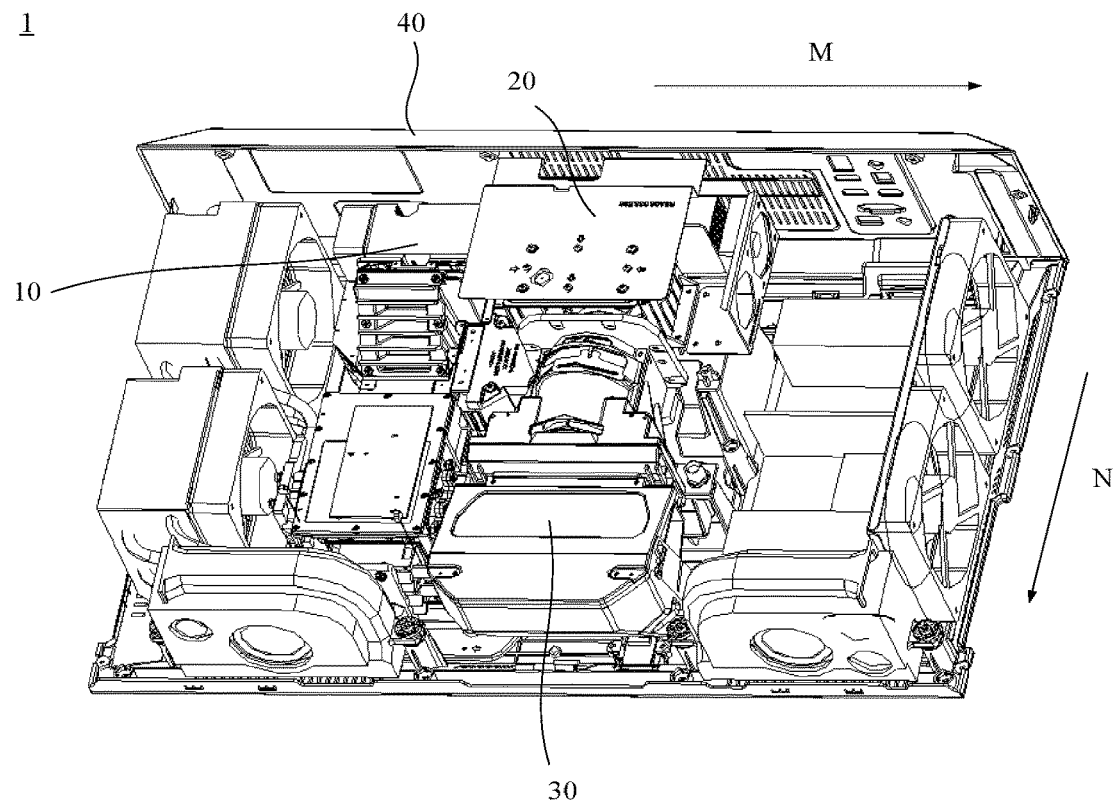
FIG. 1 is a diagram showing a structure of a laser projection apparatus, in accordance with some embodiments.

Some embodiments of the present disclosure will be described clearly and completely with reference to the accompanying drawings below. However, the described embodiments are merely some but not all embodiments of the present disclosure. All other embodiments obtained by a person of ordinary skill in the art based on the embodiments of the present disclosure shall be included in the protection scope of the present disclosure.

Unless the context requires otherwise, throughout the description and the claims, the term "comprise" and other forms thereof such as the third-person singular form "comprises" and the present participle form "comprising" are construed as an open and inclusive meaning, i.e., "including, but not limited to". In the description of the specification, terms such as "one embodiment", "some embodiments", "exemplary embodiments", "example", "specific example" or "some examples" are intended to indicate that specific features, structures, materials or characteristics related to the embodiment(s) or example(s) are included in at least one embodiment or example of the present disclosure. Schematic representations of the above terms do not necessarily refer to the same embodiment(s) or example(s). In addition, the specific features, structures, materials, or characteristics may be included in any one or more embodiments or examples in any suitable manner.

Hereinafter, terms such as "first" and "second" are used for descriptive purposes only, and are not to be construed as indicating or implying the relative importance or implicitly indicating the number of indicated technical features. Thus, features defined by "first" or "second" may explicitly or implicitly include one or more of the features. In the description of the embodiments of the present disclosure, unless otherwise specified, the term "a/the plurality of" means two or more.

In the description of some embodiments, the expression "connected" and its derivatives may be used. For example, the term "connected" may be used in the description of some embodiments to indicate that two or more components are in direct physical or electrical contact with each other. However, the term "connected" may also mean that two or more components are not in direct contact with each other, but still cooperate or interact with each other. The embodiments disclosed herein are not necessarily limited to the contents herein.

The phrase "A and/or B" includes the following three combinations: only A, only B, and a combination of A and B.

The use of the phrase "applicable to" or "configured to" herein means an open and inclusive expression, which does not exclude apparatuses that are applicable to or configured to perform additional tasks or steps.

The term such as "about", "substantially" or "approximately" as used herein includes a stated value and an average value within an acceptable range of deviation of a particular value. The acceptable range of deviation is determined by a person of ordinary skill in the art, considering measurement in question and errors associated with measurement of a particular quantity (i.e., limitations of a measurement system).

The term such as "parallel", "perpendicular" or "equal" as used herein includes a stated condition and a condition similar to the stated condition. A range of the similar condition is within an acceptable deviation range, and the acceptable deviation range is determined by a person of ordinary skill in the art, considering measurement in question and errors associated with measurement of a particular quantity (i.e., limitations of a measurement system). For example, the term "parallel" includes absolute parallelism and approximate parallelism, and an acceptable deviation range of the approximate parallelism may be, for example, a deviation within 5°. The term "perpendicular" includes absolute perpendicularity and approximate perpendicularity, and an acceptable deviation range of the approximate perpendicularity may also be, for example, a deviation within 5°. The term "equal" includes absolute equality and approximate equality, and an acceptable deviation range of the approximate equality may be that, for example, a difference between the two that are equal is less than or equal to 5% of either of the two.

FIG. 1 is a diagram showing a structure of a laser projection apparatus, in accordance with some embodiments.

In some embodiments of the present disclosure, a laser projection apparatus is provided. As shown in FIG. 1, the laser projection apparatus 1 includes an apparatus housing 40 (only a portion of the apparatus housing 40 being shown in FIG. 1), and a laser source 10, an optical engine 20, and a projection lens 30 that are assembled in the apparatus housing 40. The laser source 10 is configured to provide illumination beams (laser beams). The optical engine 20 is configured to modulate the illumination beams provided by the laser source 10 with image signals, so as to obtain projection beams. The projection lens 30 is configured to project the projection beams into an image on a screen or a wall.

The laser source 10, the optical engine 20, and the projection lens 30 are sequentially connected in a propagation direction of beams, and are each wrapped by a corresponding housing. The housings of the laser source 10, the optical engine 20 and the projection lens 30 support their corresponding optical components respectively and make the optical components meet certain sealing or airtight requirements.

Figure 2:
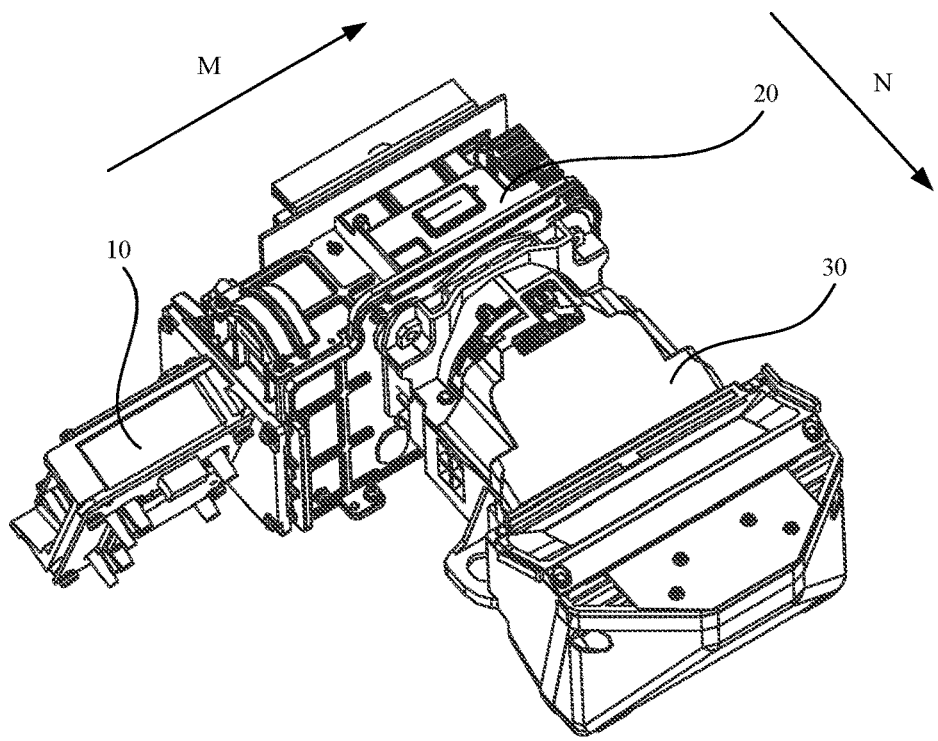
FIG. 2 is a diagram showing a partial structure of a laser projection apparatus, in accordance with some embodiments.

FIG. 2 is a diagram showing a partial structure of a laser projection apparatus, in accordance with some embodiments.

An end of the optical engine 20 is connected to the projection lens 30, and the optical engine 20 and the projection lens 30 are arranged in an exit direction of the projection beams of the laser projection apparatus 1 (referring to the N direction shown in FIG. 2). Another end of the optical engine 20 is connected to the laser source 10. In an example, as shown in FIG. 2, the laser source 10 and the optical engine 20 are arranged in sequence in the M direction, and the optical engine 20 and the projection lens 30 are arranged in sequence in the N direction, and the M direction and the N direction are perpendicular to each other. That is, the exit direction of the projection beams of the laser projection apparatus 1 is substantially perpendicular to an exit direction of the illumination beams of the laser projection apparatus 1 (referring to the M direction shown in FIG. 2). On one hand, such a connection structure may adapt to characteristics of a beam path of a reflective light valve in the optical engine 20, and on another hand, it is also conducive to shortening a length of a beam path in a one-dimensional direction, which is helpful for structural arrangement of the laser projection apparatus 1. For example, in a case where the laser source 10, the optical engine 20, and the projection lens 30 are disposed in the one-dimensional direction (e.g., the direction M perpendicular to the direction N), a length of a beam path in the one-dimensional direction is long, which is not conducive to the structural arrangement of the laser projection apparatus 1. The reflective light valve will be described below.

In some embodiments, the laser source 10 may provide beams of three primary colors sequentially (beams of other colors may also be added on a basis of the beams of three primary colors). Due to a phenomenon of visual persistence of human eyes, what the human eyes see is white beams formed by mixing the beams of three primary colors. Alternatively, the laser source 10 simultaneously outputs the beams of three primary colors, so as to continuously emit the white beams. The laser source 10 includes a laser device 100. The laser device 100 emits laser beams of at least one color, such as blue laser beams.

Figure 3:
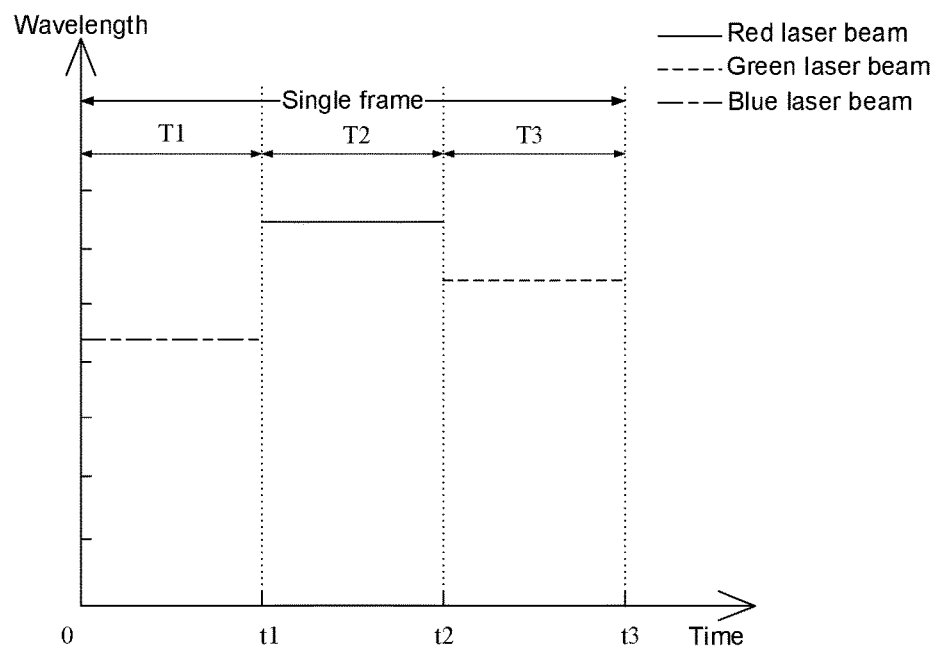
FIG. 3 is a timing diagram of a laser source in a laser projection apparatus, in accordance with some embodiments.

FIG. 3 is a timing diagram of a laser source in a laser projection apparatus, in accordance with some embodiments.

For example, as shown in FIG. 3, during a projection process of a frame of target image, the laser source 10 sequentially outputs blue laser beams, red laser beams and green laser beams. The laser source 10 outputs the blue laser beams in a first time period T1, the red laser beams in a second time period T2, and the green laser beams in a third time period T3. A time for the laser source 10 to accomplish the sequential output of each of primary color beams once is a cycle for the laser source 10 to output the primary color beams. In a display cycle of the frame of target image, the laser source 10 performs the sequential output of each of primary color beams once. Therefore, the display cycle of the frame of target image and the cycle for the laser source 10 to output the primary color beams are equal, and are both equal to a sum of the first time period T1, the second time period T2 and the third time period T3.

Figure 4:
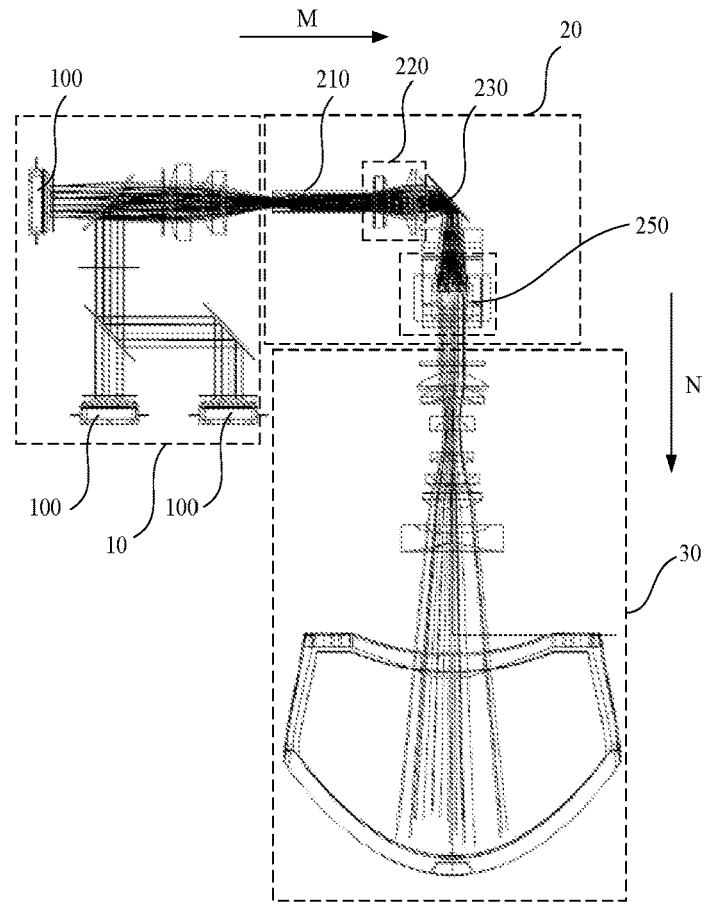
FIG. 4 is a diagram showing a beam path of a laser source, an optical engine, and a projection lens in a laser projection apparatus, in accordance with some embodiments.
Figure 5:
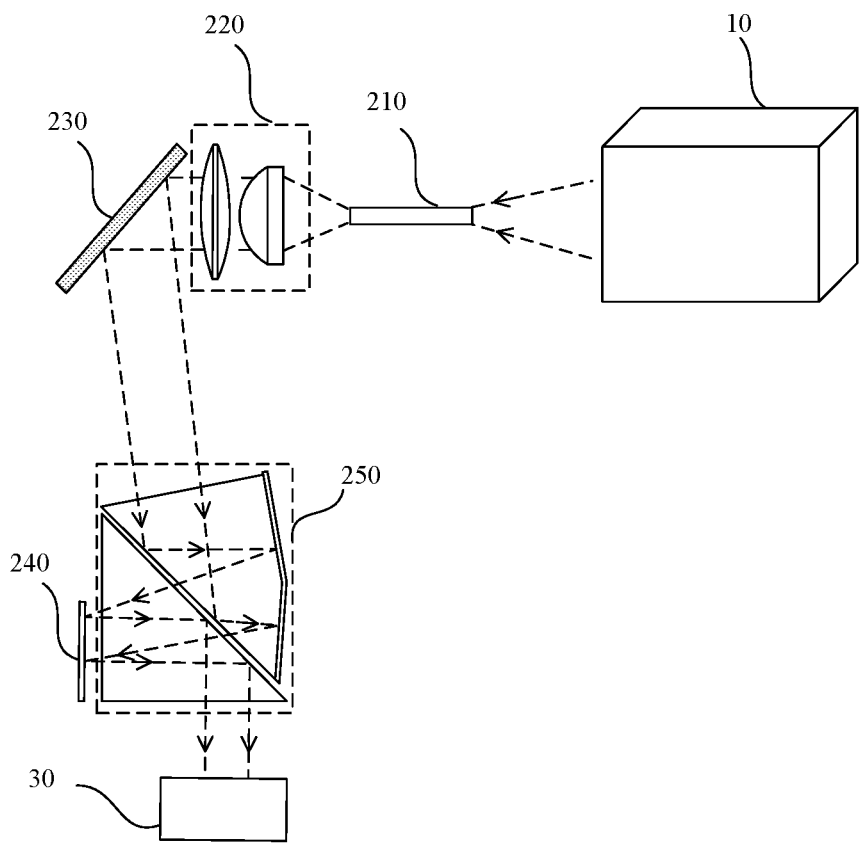
FIG. 5 is a diagram showing another beam path of a laser source, an optical engine, and a projection lens in a laser projection apparatus, in accordance with some embodiments.

FIG. 4 is a diagram showing a beam path of a laser source, an optical engine, and a projection lens in a laser projection apparatus, in accordance with some embodiments. FIG. 5 is a diagram showing another beam path of a laser source, an optical engine, and a projection lens in a laser projection apparatus, in accordance with some embodiments.

The illumination beams emitted by the laser source 10 enter the optical engine 20. Referring to FIGS. 4 and 5, the optical engine 20 includes a light pipe 210, a lens assembly 220, a reflector 230, a digital micromirror device (DMD) 240 and a prism assembly 250. The light pipe 210 may receive the illumination beams provided by the laser source 10 and homogenize the illumination beams. In addition, an outlet of the light pipe 210 may be in a shape of a rectangle, so as to have a shaping effect on a beam spot. The lens assembly 220 may first collimate the illumination beams, and then converge the collimated illumination beams and emit the converged illumination beams to the reflector 230. The reflector 230 may reflect the illumination beams to the prism assembly 250. The prism assembly 250 reflects the illumination beams to the digital micromirror device 240. The digital micromirror device 240 modulates the illumination beams, so as to obtain the projection beams, and reflects the projection beams into the projection lens 30.

Figure 6:
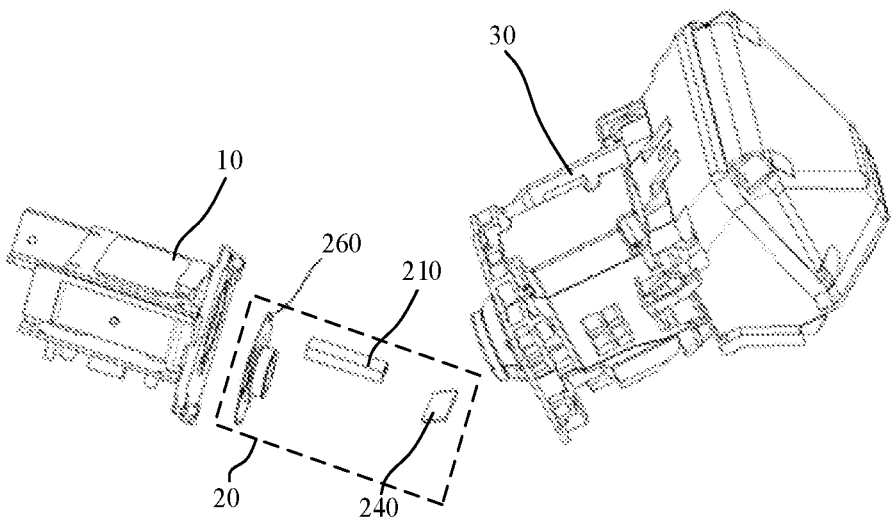
FIG. 6 is a diagram showing a structure of a laser source, an optical engine, and a projection lens in a laser projection apparatus, in accordance with some embodiments.

FIG. 6 is a diagram showing a structure of a laser source, an optical engine, and a projection lens in a laser projection apparatus, in accordance with some embodiments.

In some embodiments, as shown in FIG. 6, the optical engine 20 of the laser projection apparatus 1 further includes a beam expanding component 260. The beam expanding component 260 is located on a laser-exit side of the laser source 10 and configured to homogenize the illumination beams emitted by the laser source 10. The beam expanding component 260 may include a diffusion wheel, and the diffusion wheel includes a diffusion sheet and a shaft. The diffusion sheet may be rotated around the shaft passing through a center point of the diffusion sheet and perpendicular to the diffusion sheet, so that the laser beams may be incident on different positions of the diffusion sheet at different moments, which makes divergence angles of the laser beams at different moments different. In this way, speckle patterns with different shapes and positions formed by the laser beams during projection are dispersed and overlapped by the laser projection apparatus 1, therefore the speckles are eliminated.

In the optical engine 20, the DMD 240 plays a role of modulating the illumination beams provided by the laser source 10 through the image signals. That is, the DMD 240 controls the projection beams to display different luminance and gray scales according to different pixels of an image to be displayed, so as to finally produce an optical image. Therefore, the DMD 240 is also referred to as an optical modulator or a light valve. Depending on whether the optical modulator (or the light valve) transmits or reflects the illumination beams, the optical modulator (or the light valve) may be classified as a transmissive optical modulator (or light valve) or a reflective optical modulator (or light valve). For example, the DMD 240 shown in FIG. 5 reflects the illumination beams, and thus it is the reflective optical modulator. A liquid crystal light valve transmits the illumination beams, and thus it is the transmissive optical modulator. In addition, according to a number of the optical modulators (or the light valves) used in the optical engine 20, the optical engine 20 may be classified as a single-chip system, a double-chip system, or a three-chip system.

It will be noted that, according to a projection architecture, the optical modulators (or the light valves) may be of many different kinds, such as a liquid crystal on silicon (LCOS), a liquid crystal display (LCD) or a digital micromirror device (DMD). Since the optical engine 20 shown in FIG. 5 applies a digital light processing (DLP) projection architecture in some embodiments of the present disclosure, the optical modulators (or the light valves) in some embodiments of the present disclosure are digital micromirror devices (DMD) 240.

Figure 7:
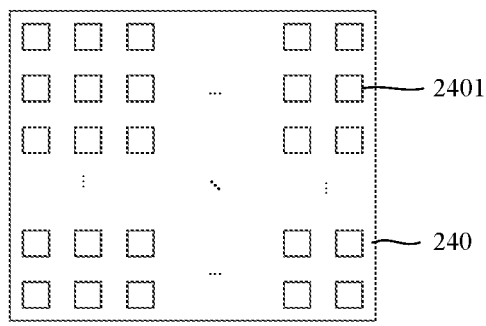
FIG. 7 is a diagram showing an arrangement of micromirrors in a digital micromirror device, in accordance with some embodiments.
Figure 8:
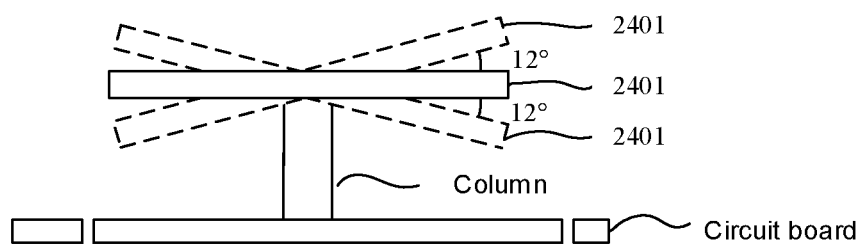
FIG. 8 is a diagram showing a swing position of a micromirror in the digital micromirror device shown in FIG. 7.
Figure 9:
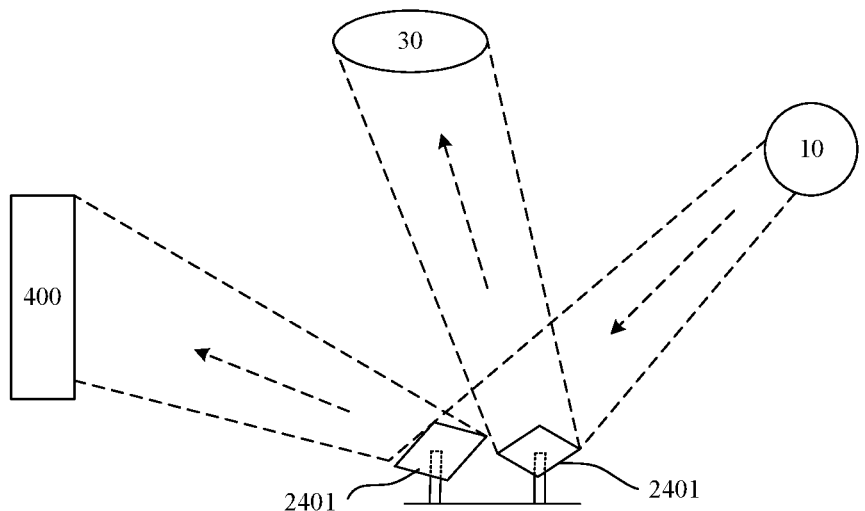
FIG. 9 is a schematic diagram showing operation of micromirrors, in accordance with some embodiments.

FIG. 7 is a diagram showing an arrangement of micromirrors in a digital micromirror device, in accordance with some embodiments. FIG. 8 is a diagram showing a swing position of a micromirror in the digital micromirror device shown in FIG. 7. FIG. 9 is a schematic diagram showing operation of micromirrors, in accordance with some embodiments.

As shown in FIG. 7, the digital micromirror device 240 includes thousands of micromirrors 2401 that may be individually driven. These micromirrors 2401 are arranged in an array, and each micromirror 2401 corresponds to one pixel in the image to be displayed. As shown in FIG. 8, in the DLP projection architecture, each micromirror 2401 is equivalent to a digital switch. The micromirror may swing within a range of plus or minus 12 degrees (i.e., ±12°) or a range of plus or minus 17 degrees (i.e., ±17°) due to an action of an external force.

As shown in FIG. 9, a laser beam reflected by the micromirror 2401 at a negative deflection angle is referred to as an OFF laser beam, and the OFF laser beam is an ineffective laser beam, and which usually irradiates on the housing of the optical engine 20, or is absorbed by a laser absorption portion 400. A laser beam reflected by the micromirror 2401 at a positive deflection angle is referred to as an ON laser beam. The ON laser beam is an effective beam reflected by the micromirror 2401 on a surface of the DMD 240 when it receives irradiation of the illumination beams, and the ON laser beam enters the projection lens 30 at a positive deflection angle for projection imaging. An ON state of the micromirror 2401 is a state that the micromirror 2401 is in and may be maintained when the illumination beams emitted by the laser source 10 may enter the projection lens 30 after being reflected by the micromirror 2401. That is, the micromirror 2401 is in a state of the positive deflection angle. An OFF state of the micromirror 2401 is a state that the micromirror 2401 is in and may be maintained when the illumination beams emitted by the laser source 10 does not enter the projection lens 30 after being reflected by the micromirror 2401. That is, the micromirror 2401 is in a state of the negative deflection angle.

In a display cycle of a frame of an image, some or all of the micromirrors 2401 are switched once between the ON state and the OFF state, so that gray scales of pixels in the frame image are achieved according to durations of the micromirrors 2401 in the ON state and the OFF state. For example, in a case where the pixels have 256 gray scales from 0 to 255, micromirrors 2401 corresponding to a gray scale 0 are each in the OFF state in an entire display cycle of the frame of the image, micromirrors 2401 corresponding to a gray scale 255 are each in the ON state in the entire display cycle of the frame of the image, and micromirrors 2401 corresponding to a gray scale 127 are each in the ON state for a half of time and in the OFF state for another half of time in the display cycle of the frame of the image. Therefore, by controlling a state that each micromirror 2401 in the DMD 240 is in and a duration of each state in the display cycle of the frame of the image through the image signals, luminance (the gray scale) of a pixel corresponding to the micromirror 2401 may be controlled, thereby modulating the illumination beams projected onto the DMD 240.

Referring to FIGS. 4 and 5, the light pipe 210, the lens assembly 220 and the reflector 230 at a front end of the DMD 240 form an illumination path, and the illumination beams emitted by the laser source 10 pass through the illumination path to have a size and an incident angle which are met the requirements of the DMD 240.

As shown in FIG. 4, the projection lens 30 includes a combination of a plurality of lenses, which are usually divided by groups, and are divided into a three-segment combination including a front group, a middle group and a rear group, or a two-segment combination including a front group and a rear group. The front group is a lens group proximate to a laser-exit side of the laser projection apparatus 1 (i.e., a side of the projection lens 30 away from the optical engine 20 along the N direction in FIG. 4), and the rear group is a lens group proximate to a laser-exit side of the optical engine 20 (i.e., a side of the projection lens 30 proximate to the optical engine 20 along the opposite direction of the N direction in FIG. 4). The projection lens 30 may be a zoom projection lens, or a prime focus-adjustable projection lens, or a prime projection lens.

For ease of description, some embodiments of the present disclosure are mainly described by taking an example in which the laser source 10 sequentially outputs the beams of three primary colors, the laser projection apparatus 1 adopts the DLP projection architecture, and the optical modulator of the optical engine 20 is the digital micromirror device 240, however, this should not be construed as a limitation of the present disclosure.

The laser device 100 of the laser source 10 according to some embodiments of the present disclosure will be described in detail below.

Figure 10:
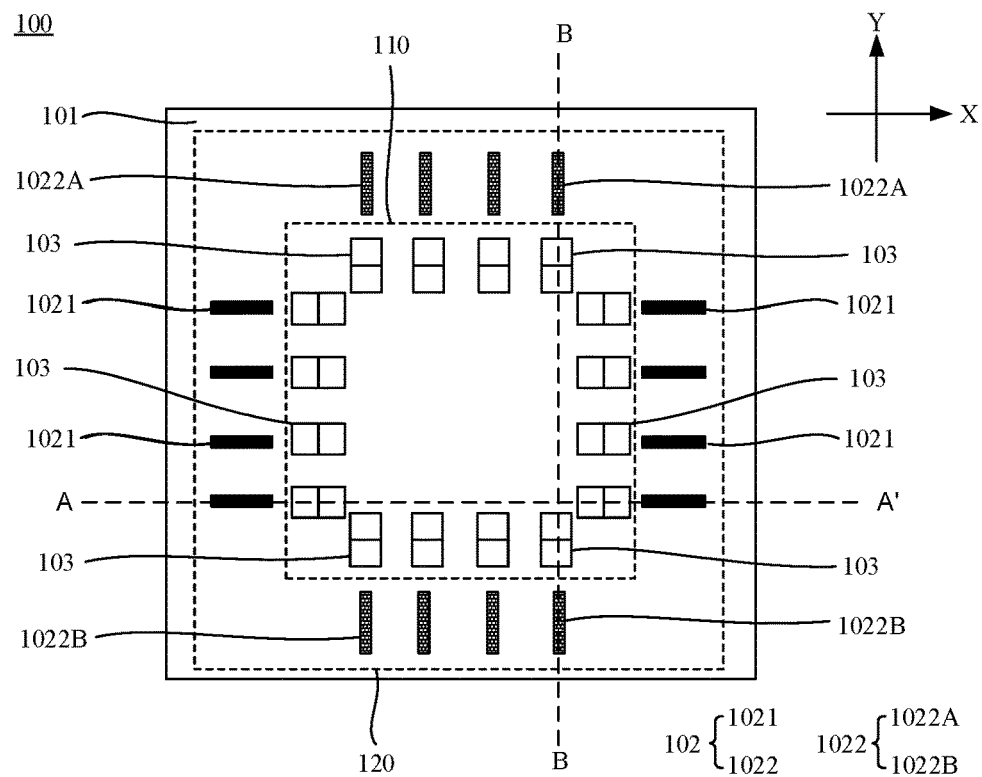
FIG. 10 is a diagram showing a structure of a laser device, in accordance with some embodiments.
Figure 11:
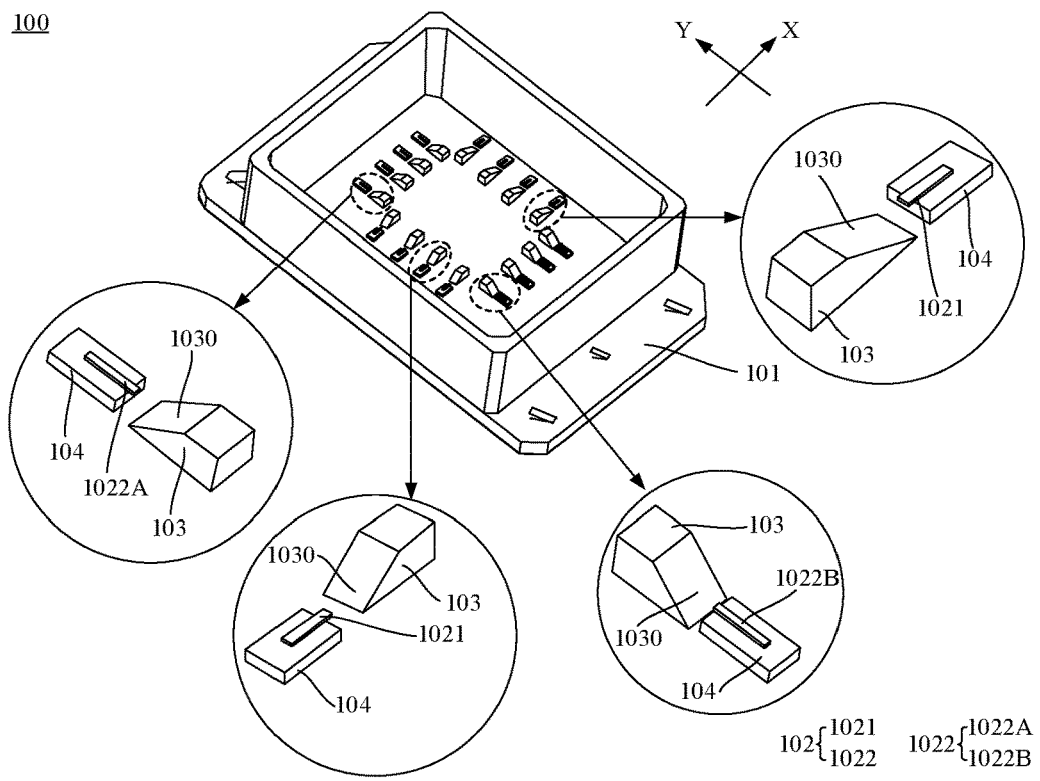
FIG. 11 is a diagram showing a structure of a laser device from another perspective, in accordance with some embodiments.

FIG. 10 is a diagram showing a structure of a laser device, in accordance with some embodiments. FIG. 11 is a diagram showing a structure of a laser device from another perspective, in accordance with some embodiments.

In some embodiments, as shown in FIGS. 10 and 11, the laser device 100 includes a base plate 101, a reflecting prism 103 and a plurality of light-emitting components 102. The plurality of light-emitting components 102 are disposed on the base plate 101 and are configured to emit laser beams. The reflecting prism 103 is disposed on the base plate 101 and is configured to reflect the laser beams emitted by the light-emitting components 102 in a direction away from the base plate 101, so that the laser device 100 may emit the illumination beams. For example, the reflecting prism 103 and the plurality of light-emitting components 102 are disposed on the base plate 101 by means of a surface mount technology. The reflecting prism 103 corresponds to at least one of the plurality of light-emitting components 102, and the reflecting prism 103 is located on a laser-exit side of the corresponding light-emitting component 102.

In some embodiments, as shown in FIG. 10, the base plate 101 includes a first region 110 (e.g., a middle region) and a second region 120 (e.g., a peripheral region), and the second region 120 surrounds the first region 110.

In some embodiments, the base plate 101 is made of at least one of oxygen free copper (OFC) or kovar alloy. The kovar alloy may be an iron-nickel-cobalt alloy, or an iron-nickel-cobalt-glass sealing alloy. In a case where the base plate 101 is made of the oxygen free copper, a coefficient of thermal conductivity of the oxygen free copper is large, so that the base plate 101 conducts heat generated by the plurality of light-emitting components 102, so as to dissipate heat from the plurality of light-emitting components 102.

Figure 12:
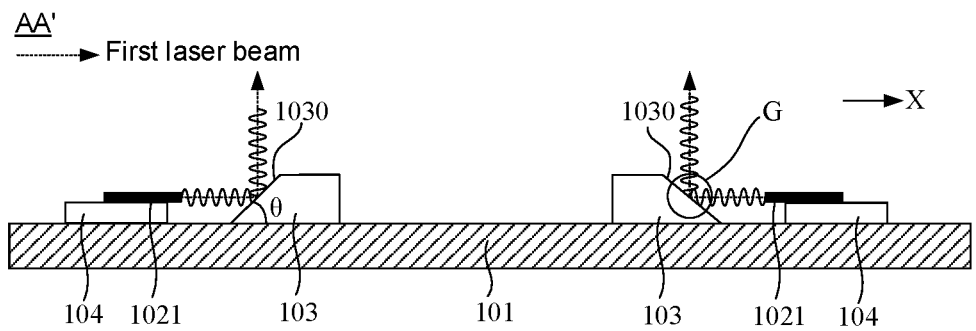
FIG. 12 is a sectional view of the laser device in FIG. 10 taken along the line AA'.
Figure 13:
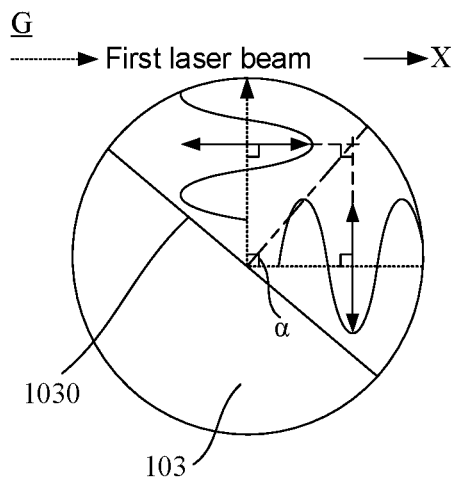
FIG. 13 is a partial enlarged view of the circle G in FIG. 12.
Figure 14:
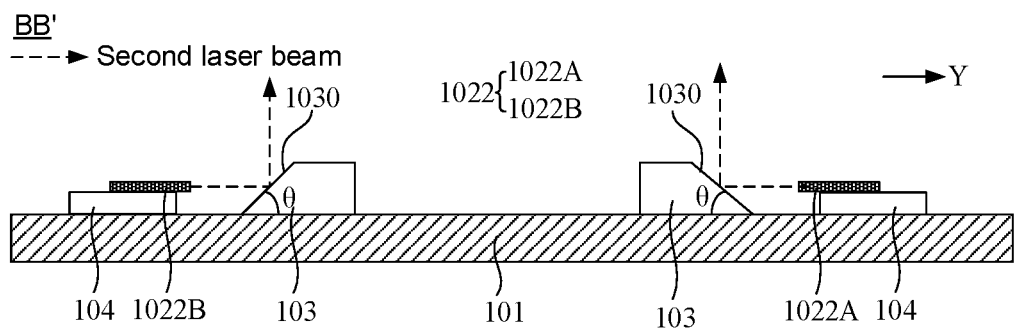
FIG. 14 is a sectional view of the laser device in FIG. 10 taken along the line BB'.
Figure 15:
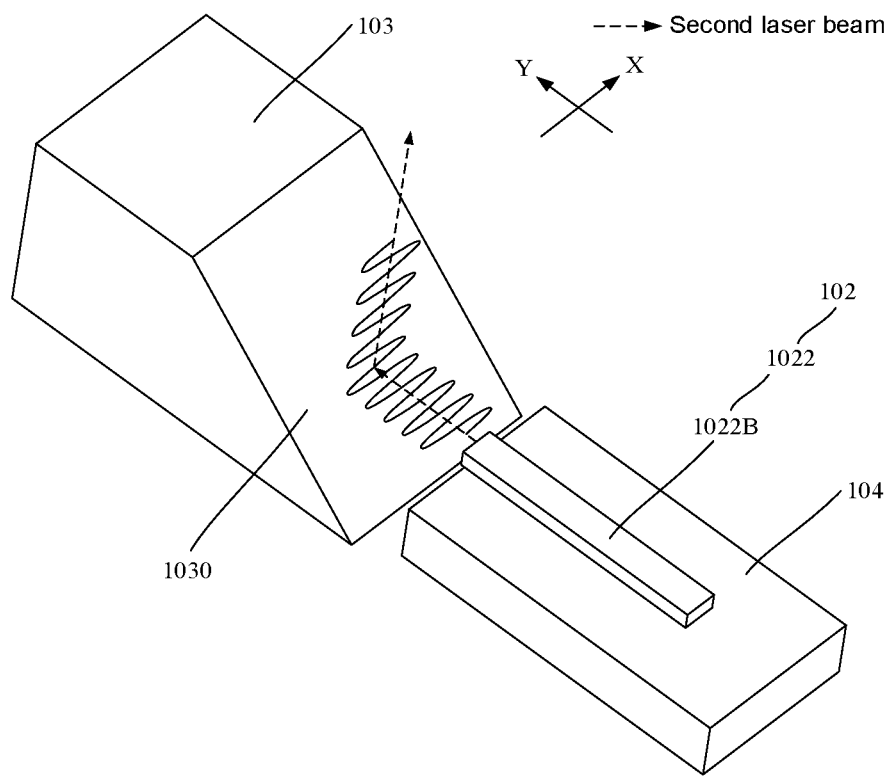
FIG. 15 is a schematic diagram showing propagation of the second laser beam in FIG. 14.

FIG. 12 is a sectional view of the laser device in FIG. 10 taken along the line AA'. FIG. 13 is a partial enlarged view of the circle G in FIG. 12. FIG. 14 is a sectional view of the laser device in FIG. 10 taken along the line BB'. FIG. 15 is a schematic diagram showing propagation of the second laser beam in FIG. 14.

In some embodiments, as shown in FIG. 11, the reflecting prism 103 includes a reflecting surface 1030. The reflecting surface 1030 is a surface of the reflecting prism 103 opposite to the corresponding light-emitting component 102, and the reflecting surface 1030 is configured to reflect the laser beams emitted by the light-emitting components 102 in the direction away from the base plate 101. For example, the surface of the reflecting prism 103 corresponding to the light-emitting component 102 may be coated with a reflective film, so as to form the reflecting surface 1030.

In some embodiments, as shown in FIGS. 12 and 14, a first included angle θ is provided between the reflecting surface 1030 of the reflecting prism 103 and a plane where the base plate 101 is located, and the first included angle θ is 45°. In this case, as shown in FIG. 13, if an incident laser beam at the reflecting surface 1030 is parallel to the base plate 101, a transmission direction of a reflected laser beam at the reflecting surface 1030 is perpendicular to the base plate 101, and an included angle α between the incident laser beam and the reflected laser beam is 90°.

In some embodiments, the laser device 100 includes one reflecting prism 103 or a plurality of reflecting prisms 103.

In some embodiments, the one reflecting prism 103 has a plurality of reflecting surfaces 1030.

In order to reduce a distance between the plurality of reflecting prisms 103 in the laser device 100, in some embodiments, as shown in FIG. 10, the plurality of reflecting prisms 103 are located in the first region 110 of the base plate 101, and the plurality of light-emitting components 102 are located in the second region 120 of the base plate 101. Alternatively, in a case where the laser device 100 includes one reflecting prism 103 and the one reflecting prism 103 has the plurality of reflecting surfaces 1030, the one reflecting prism 103 may be located in the first region 110 of the base plate 101, and the plurality of light-emitting components 102 may be located in the second region 120 of the base plate 101.

In this way, distances between the laser beams emitted by the plurality of light-emitting components 102 are small when the laser beams exit from the laser device 100, which makes beams formed by the laser beams exiting from the laser device 100 thin, so that a size of a beam spot formed by the laser beams exiting from the laser device 100 is small, the luminance difference of the beam spots is small, and the luminance of the beam spot is uniform. Of course, the plurality of light-emitting components 102 may also be located in the first region 110 of the base plate 101, and the one reflecting prism 103 or the plurality of reflecting prisms 103 may also be located in the second region 120 of the base plate 101.

It will be noted that, FIGS. 10 and 11 illustrate by taking an example in which no other components are provided in a region surrounded by the one reflecting prism 103 or the plurality of reflecting prisms 103. In this case, as the number of the light-emitting components 102 of the laser device 100 increases, an area of the region surrounded by the one reflecting prism 103 or the plurality of reflecting prisms 103 increases, so that the size of the beam spot formed by the laser beams exiting from the laser device 100 and the luminance difference of the beam spots increase. Therefore, in some embodiments of the present disclosure, it is possible to prevent the size of the beam spot formed by the laser beams exiting from the laser device 100 from being excessively large through reasonably providing the number of the light-emitting components 102 (e.g., the number of the light-emitting components 102 being less than or equal to 20 or 16). In this case, the power of the laser device 100 is small, and the laser device 100 may be used as the laser source 10 of a micro laser projection apparatus.

Of course, the plurality of light-emitting components 102 may also be disposed in the region surrounded by the one reflecting prism 103 or the plurality of reflecting prisms 103, so as to improve the luminance of a middle position of the beam spot formed by the laser beams exiting from the laser device 100, and reduce the luminance difference of the beam spots formed by the laser beams exiting from the laser device 100. Moreover, it is also possible to provide more light-emitting components 102 in the laser device 100, so as to improve a utilization rate of the space of the laser device 100 and facilitate the miniaturization of the laser device 100.

The following details are described by taking an example in which the reflecting prism 103 is located in the first region 110 of the base plate 101 and the plurality of light-emitting components 102 are located in the second region 120 of the base plate 101.

In some embodiments, as shown in FIGS. 10 and 11, the plurality of light-emitting components 102 include a first light-emitting component 1021 and a second light-emitting component 1022. The first light-emitting component 1021 emits a first laser beam, and the second light-emitting component 1022 emits a second laser beam. A polarization direction of the first laser beam and a polarization direction of the second laser beam are perpendicular (e.g., orthogonal) to each other. That is to say, the polarization direction of the first laser beam emitted by the first light-emitting component 1021 and radiating on a corresponding reflecting prism 103 is perpendicular (e.g., orthogonal) to the polarization direction of the second laser beam emitted by the second light-emitting component 1022 and radiating on a corresponding reflecting prism 103. For example, the first laser beam is P-polarized light, and the second laser beam is S-polarized light. Alternatively, the first laser beam is S-polarized light, and the second laser beam is P-polarized light.

It will be noted that, in a case where the P-polarized light penetrates a surface of an optical element at a non-perpendicular angle, a polarization direction of the P-polarized light is located in a plane where the incident laser beam and the reflected laser beam are located. In a case where the S-polarized light penetrates the surface of the optical element at a non-perpendicular angle, a polarization direction of the S-polarized light is perpendicular to the plane where the incident laser beam and the reflected laser beam are located.

Figure 16:
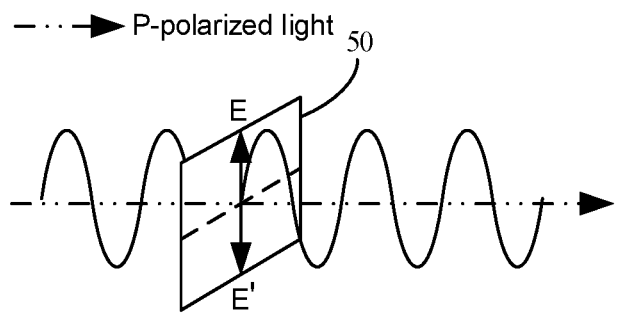
FIG. 16 is a schematic diagram showing propagation of P-polarized light, in accordance with some embodiments.
Figure 17:
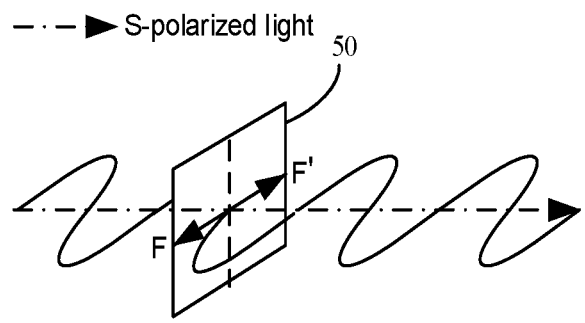
FIG. 17 is a schematic diagram showing propagation of S-polarized light, in accordance with some embodiments.

FIG. 16 is a schematic diagram showing propagation of P-polarized light, in accordance with some embodiments. FIG. 17 is a schematic diagram showing propagation of S-polarized light, in accordance with some embodiments. As shown in FIG. 16, in a case where the P-polarized light passes through a plane 50 shown in FIG. 16, the polarization direction of the P-polarized light may be the direction EE' shown in FIG. 16, and the waveform in FIG. 16 is a waveform of the P-polarized light. As shown in FIG. 17, in a case where the S-polarized light passes through the plane 50 shown in FIG. 17, the polarization direction of the S-polarized light may be the direction FF' shown in FIG. 17, and the waveform in FIG. 17 is a waveform of the S-polarized light. In the plane 50, the direction EE' is perpendicular to the direction FF'.

It will be noted that, a polarization direction of a laser beam is perpendicular to a propagation direction of the laser beam. For example, as shown in FIGS. 16 and 17, the direction EE' is perpendicular to a propagation direction of the P-polarized light, and the direction FF' is perpendicular to a propagation direction of the S-polarized light.

A first propagation direction of the first laser beam emitted by the first light-emitting component 1021 is perpendicular to a second propagation direction of the second laser beam emitted by the second light-emitting component 1022. That is to say, a laser-exit direction of the first light-emitting component 1021 is perpendicular to a laser-exit direction of the second light-emitting component 1022.

In some embodiments, the propagation directions (e.g., the first propagation direction and the second propagation direction) of the laser beams emitted by the first light-emitting component 1021 and the second light-emitting component 1022 are parallel to the base plate 101.

In some embodiments, an arrangement direction of a light-emitting component 102 and a reflecting prism 103 corresponding to the light-emitting component 102 is same as a laser-exit direction of the light-emitting component 102.

For example, as shown in FIGS. 10 and 11, an arrangement direction of the first light-emitting component 1021 and the reflecting prism 103 corresponding to the first light-emitting component 1021 is parallel to the first direction X, and the arrangement direction is same as the laser-exit direction of the first light-emitting component 1021. An arrangement direction of the second light-emitting component 1022 and the reflecting prism 103 corresponding to the second light-emitting component 1022 is parallel to the second direction Y, and the arrangement direction is same as the laser-exit direction of the second light-emitting component 1022. The first direction X is perpendicular to the second direction Y, and a plane where the first direction X and the second direction Y are located is parallel to the base plate 101.

In some embodiments of the present disclosure, the laser-exit directions of the first light-emitting component 1021 and the second light-emitting component 1022 are parallel to the base plate 101, and the propagation directions of the laser beams emitted by the first light-emitting component 1021 and the second light-emitting component 1022 are perpendicular to each other. Moreover, in the first light-emitting component 1021 and the second light-emitting component 1022, the polarization direction of the laser beam emitted by one light-emitting component 102 is parallel to the base plate 101, and the polarization direction of the laser beam emitted by another light-emitting component 102 is perpendicular to the base plate 101.

For example, the polarization direction of the first laser beam emitted by the first light-emitting component 1021 is parallel to the base plate 101, and the polarization direction of the second laser beam emitted by the second light-emitting component 1022 is perpendicular to the base plate 101. Alternatively, the polarization direction of the first laser beam emitted by the first light-emitting component 1021 is perpendicular to the base plate 101, and the polarization direction of the second laser beam emitted by the second light-emitting component 1022 is parallel to the base plate 101.

Assuming that the first propagation direction of the first laser beam emitted by the first light-emitting component 1021 is parallel to the base plate 101, the polarization direction of the first laser beam is perpendicular to the base plate 101, and the second propagation direction and the polarization direction of the second laser beam emitted by the second light-emitting component 1022 are parallel to the base plate 101. In this case, the polarization direction of the second laser beam emitted by the second light-emitting component 1022 is parallel to the first propagation direction of the first laser beam emitted by the first light-emitting component 1021.

As shown in FIGS. 14 and 15, for a laser beam radiating on the reflecting surface 1030 of the reflecting prism 103, if the polarization direction of the laser beam (e.g., the second laser beam) is parallel to the base plate 101, the polarization of the laser beam is parallel to the reflecting surface 1030. In this way, after the laser beam is reflected by the reflecting surface 1030, the polarization direction of the laser beam is not changed. That is to say, the polarization direction of the laser beam reflected by the reflecting surface 1030 is still parallel to the base plate 101.

As shown in FIGS. 12 and 13, if the polarization direction of the laser beam (e.g., the first laser beam) is perpendicular to the base plate 101, the polarization direction of the laser beam intersects with the reflecting surface 1030. In this case, a certain included angle is provided between the polarization direction of the laser beam and the reflecting surface 1030. In this way, after the laser beam is reflected by the reflecting surface 1030, the polarization direction of the laser beam is changed, and an angle at which the polarization direction of the laser beam is changed is same as the included angle α between the incident laser beam and the reflected laser beam at the reflecting surface 1030. For example, as shown in FIG. 13, the included angle α between the incident laser beam and the reflected laser beam may be 90°.

It will be noted that, the change of the polarization direction of the laser beam is equivalent to the change of the polarization polarity of the laser beam.

The polarization direction of the first laser beam emitted by the first light-emitting component 1021 intersects with the corresponding reflecting surface 1030. Since the first included angle θ is 45°, and the included angle α between the incident laser beam and the reflected laser beam is 90°, after being reflected by the reflecting surface 1030, the polarization direction of the first laser beam is changed by 90° (i.e., the polarization polarity of the first laser beam is changed by 90°). In this case, the polarization direction of the first laser beam reflected by the reflecting surface 1030 is parallel to the base plate 101, and is parallel to the first propagation direction of the first laser beam (i.e., the laser-exit direction of the first light-emitting component 1021).

For example, FIG. 12 is a schematic diagram showing propagation of the first laser beam emitted by the first light-emitting component 1021. FIG. 12 shows a waveform of the first laser beam emitted by the first light-emitting component 1021. As shown in FIG. 12, after the first light-emitting component 1021 emits the first laser beam, the first laser beam radiates on the reflecting prism 103 corresponding to the first light-emitting component 1021. The first propagation direction of the first laser beam is parallel to the first direction X, and the polarization direction of the first laser beam is perpendicular to the base plate 101. Moreover, the polarization direction of the first laser beam is perpendicular to a plane defined by the first direction X and the second direction Y. In this case, as shown in FIG. 13, the polarization direction of the first laser beam emitted by the first light-emitting component 1021 intersects with the reflecting surface 1030 of the corresponding reflecting prism 103. In this way, after the first laser beam is reflected by the reflecting surface 1030 of the reflecting prism 103 and exits in the direction away from the base plate 101, the polarization direction of the first laser beam is changed and becomes parallel to the first direction X.

In a case where the first included angle θ is 45°, the polarization direction of the second laser beam emitted by the second light-emitting component 1022 is parallel to the corresponding reflecting surface 1030. After being reflected by the reflecting surface 1030, the polarization direction of the second laser beam is not changed. In this case, the polarization direction of the second laser beam reflected by the reflecting surface 1030 is still parallel to the first propagation direction of the first laser beam emitted by the first light-emitting component 1021. Therefore, after the laser beams emitted by the first light-emitting component 1021 and the second light-emitting component 1022 exit in the direction away from the base plate 101, the polarization directions of the first laser beam and the second laser beam are same.

For example, FIG. 14 is a schematic diagram showing propagation of the second laser beam emitted by the second light-emitting component 1022. As shown in FIG. 14, after the second light-emitting component 1022 emits the second laser beam, the second laser beam radiates on the corresponding reflecting prism 103. The second propagation direction of the second laser beam is parallel to the second direction Y, and the polarization direction of the second laser beam is parallel to the base plate 101. Moreover, as shown in FIG. 15, the polarization direction of the second laser beam is parallel to the first direction X. In this case, the polarization direction of the second laser beam emitted by the second light-emitting component 1022 is parallel to the reflecting surface 1030 of the corresponding reflecting prism 103. In this way, after the second laser beam is reflected by the reflecting surface 1030 of the reflecting prism 103 and exits in the direction away from the base plate 101, the polarization direction of the second laser beam is not changed, and the polarization direction of the second laser beam is still parallel to the first direction X.

The polarization directions of the laser beams emitted by the first light-emitting component 1021 and the second light-emitting component 1022 are same after the laser beams exit from the laser device 100, and the polarization directions of the first laser beam and the second laser beam are parallel to the first direction X. In this way, the laser device 100 may emit laser beams with a same polarization direction.

In some embodiments of the present disclosure, the polarization directions of the laser beams emitted by the first light-emitting component 1021 and the second light-emitting component 1022 are perpendicular to each other, and the propagation directions of the laser beams emitted by the first light-emitting component 1021 and the second light-emitting component 1022 are perpendicular to each other, and the propagation directions are parallel to the base plate 101. Since the polarization direction of the laser beam is perpendicular to the propagation direction of the laser beam, in the first light-emitting component 1021 and the second light-emitting component 1022, the polarization direction of the laser beam emitted by one light-emitting component 102 is parallel to the base plate 101, and the polarization direction of the laser beam emitted by another light-emitting component 102 is perpendicular to the base plate 101. In this case, the reflecting prism 103 may change the polarization direction of the laser beam whose polarization direction is perpendicular to the base plate 101, so that the polarization polarity of the laser beam may be changed by 90°. In this way, after the laser beams emitted by the first light-emitting component 1021 and the second light-emitting component 1022 are reflected by the reflecting prism 103, the polarization directions of the laser beams are same, and the laser source 10 of the laser projection apparatus 1 may directly obtain the laser beams with the same polarization direction. Therefore, there is no need to provide a half-wave plate to change the polarization direction of the laser beam, which reduces a volume of the laser projection apparatus 1 and is conducive to the miniaturization of the laser projection apparatus 1.

In addition, in a case where the laser device 100 emits two laser beams with different polarization directions, laser beams with different polarization directions have different reflectivity on the screen. For example, the screen has a greater reflectivity for the P-polarized light than that for the S-polarized light. Moreover, there is a difference in transmittance and reflectivity of the P-polarized light and the S-polarized light due to the optical lens itself. For example, the optical lens has a greater transmittance for the P-polarized light than that for the S-polarized light. Therefore, compared with the S-polarized light, more of the P-polarized light exiting from the laser device 100 may radiate on the screen and more of it may be reflected into the human eyes. In this way, the projected image is prone to local color cast problems (e.g., partial regions of the projected image being reddish), so that the actual displayed color is different from the desired displayed color. Moreover, the larger the number of optical lenses in the laser projection apparatus 1 (e.g., the ultra-short-focus laser projection apparatus), the more apparent the color cast phenomenon of the projected image.

In some embodiments of the present disclosure, the laser device 100 is able to directly emit the laser beams with the same polarization direction. Therefore, the laser beams emitted by the laser device 100 have the same transmissivity when passing through the optical lenses, and have the same reflectivity on the screen. In this way, the luminous fluxes of the laser beams with different colors entering the human eyes after being reflected by the screen are relatively balanced, thereby improving the color cast phenomenon of the projected image and improving the display effect of the projected image.

FIGS. 10 and 11 illustrate by taking an example in which the plurality of reflecting prisms 103 correspond to the plurality of light-emitting components 102. Of course, the present disclosure is not limited thereto.

In some embodiments, in the laser device 100, one reflecting prism 103 may correspond to at least two of the plurality of light-emitting components 102. For example, the at least two light-emitting components 102 may be located on a same side of the corresponding reflecting prism 103, and the at least two light-emitting components 102 are adjacent to each other. In this way, the reflecting surface 1030 of the reflecting prism 103 proximate to the corresponding light-emitting components 102 may reflect the laser beams emitted by the at least two light-emitting components 102. For another example, the at least two light-emitting components 102 may also be located on different sides of the reflecting prism 103. For example, the at least two light-emitting components 102 are located on two sides of the reflecting prism 103 and are opposite to each other. In this case, the reflecting prism 103 has two reflecting surfaces 1030 that are disposed opposite to each other, and the two reflecting surfaces 1030 each may reflect the laser beam emitted by the light-emitting component 102 corresponding to the reflecting surface 1030.

In some embodiments, adjacent two or more light emitting components in the plurality of light-emitting components 102 of the laser device 100 correspond to a same reflecting prism 103.

Figure 18:
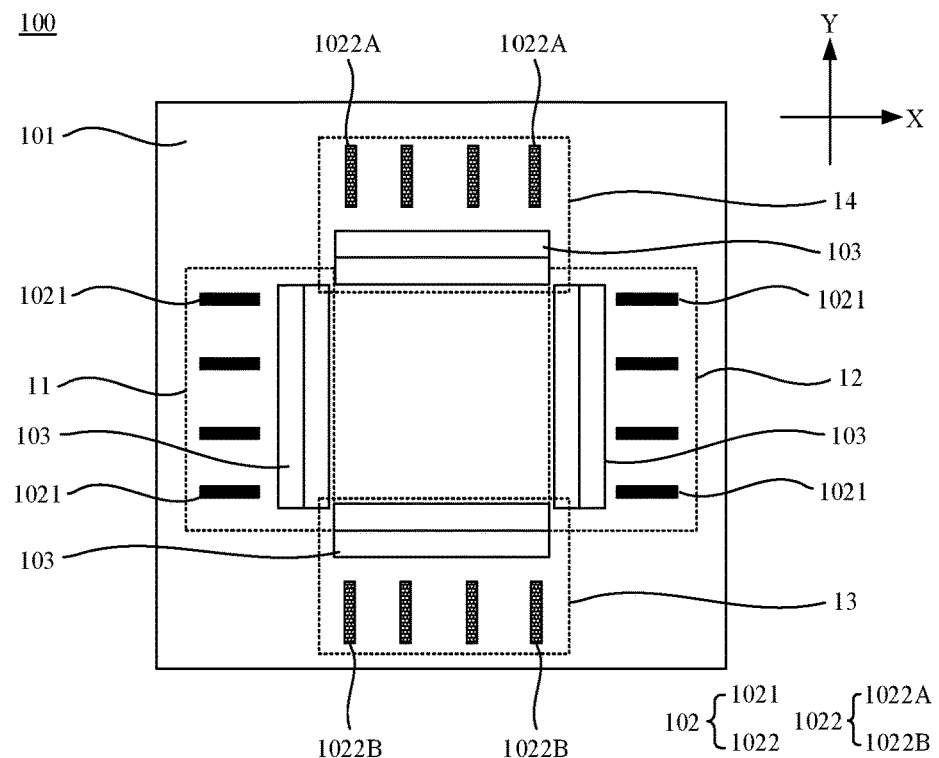
FIG. 18 is a diagram showing a structure of another laser device, in accordance with some embodiments.

For example, FIG. 18 is a diagram showing a structure of another laser device, in accordance with some embodiments. As shown in FIG. 18, the laser device 100 includes a first light-emitting assembly 11, a second light-emitting assembly 12, a third light-emitting assembly 13 and a fourth light-emitting assembly 14.

The first light-emitting assembly 11, the second light-emitting assembly 12, the third light-emitting assembly 13 and the fourth light-emitting assembly 14 each include a plurality of light-emitting components 102 and one reflecting prism 103, and the plurality of light-emitting components 102 are located on a same side of the one reflecting prism 103. The plurality of light-emitting components 102 and the corresponding reflecting prism 103 may be arranged in the first direction X or in the second direction Y, and an arrangement direction of the plurality of light-emitting components 102 is perpendicular to an arrangement direction of the plurality of light-emitting components 102 and the corresponding reflecting prism 103.

It will be noted that, FIG. 18 illustrates by taking an example in which the adjacent two or more light-emitting components 102 in each light-emitting assembly correspond to a same reflecting prism 103. For example, two adjacent light-emitting components 102 in each light-emitting assembly may correspond to the same reflecting prism 103, or three adjacent light-emitting components 102 may correspond to the same reflecting prism 103.

In some embodiments, the plurality of light-emitting components 102 of the laser device 100 may also correspond to a same reflecting prism 103. In this case, the laser device 100 includes only one reflecting prism 103.

Figure 19:
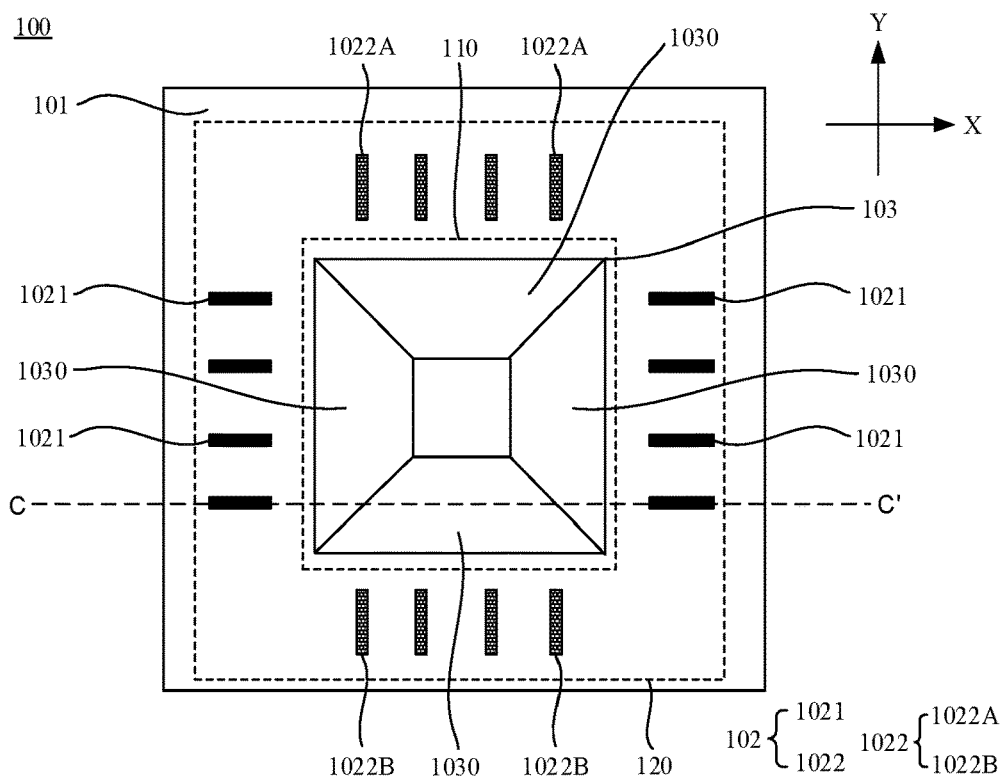
FIG. 19 is a diagram showing a structure of yet another laser device, in accordance with some embodiments.

For example, FIG. 19 is a diagram showing a structure of yet another laser device, in accordance with some embodiments. As shown in FIG. 19, the one reflecting prism 103 is located in the first region 110 of the base plate 101, and the plurality of light-emitting components 102 of the laser device 100 are located in the second region 120 of the base plate 101. The plurality of light-emitting components 102 correspond to the one reflecting prism 103, and the one reflecting prism 103 is in a shape of a frustum of a pyramid (e.g., a regular square frustum). Four side surfaces of the frustum of the pyramid are all reflecting surfaces 1030, and each reflecting surface 1030 reflects the laser beam radiating on the reflecting surface 1030 and make the laser beam exit in the direction away from the base plate 101.

In this way, the laser beams emitted by the plurality of light-emitting components 102 may exit as long as the one reflecting prism 103 in a shape of the frustum of the pyramid is mounted on the base plate 101 of the laser device 100, which simplifies the process of surface mount technology of the reflecting prism 103. Moreover, the only one reflecting prism 103 in a shape of the frustum of the pyramid is disposed on the base plate 101, which may make the arrangement of the plurality of light-emitting components 102 compact and reduce the volume of the laser device 100. In addition, areas of the four side surfaces of the reflecting prism 103 in a shape of the frustum of the pyramid are large. Therefore, when the reflecting prism 103 is mounted, it is only necessary to make the laser beams emitted by the plurality of light-emitting components 102 radiate on the corresponding side surface of the reflecting prism 103, the mounting accuracy of the reflecting prism 103 is low, and it is easy to install the reflecting prism 103.

In some embodiments, as shown in FIGS. 10, 18 and 19, the first light-emitting components 1021 are located on two sides of the first region 110 in the first direction X, and the second light-emitting components 1022 are located on two sides of the first region 110 in the second direction Y.

For example, as shown in FIGS. 10, 18 and 19, the plurality of light-emitting components 102 of the laser device 100 enclose a rectangle. The first light-emitting components 1021 may be located on a group of opposite sides of the rectangle, and the second light-emitting components 1022 may be located on another group of opposite sides of the rectangle. In this case, the light-emitting components 102 located on a same side of the first region 110 are arranged in the first direction X or the second direction Y. Of course, the plurality of light-emitting components 102 of the laser device 100 may also enclose other shapes.

In some embodiments, the second light-emitting component 1022 includes a first light-emitting sub-component 1022A and a second light-emitting sub-component 1022B, and the second laser beam emitted by the second light-emitting component 1022 includes a first laser sub-beam and a second laser sub-beam. The first light-emitting sub-component 1022A and the second light-emitting sub-component 1022B of the second light-emitting component 1022 are located on different sides of the two sides of the first region 110 respectively. Alternatively, the first light-emitting sub-component 1022A and the second light-emitting sub-component 1022B of the second light-emitting component 1022 are alternately arranged on a same side of the two sides of the first region 110.

For example, in a case where the plurality of light-emitting components 102 of the laser device 100 enclose a rectangle and the second light-emitting components 1022 are located on the another group of opposite sides of the rectangle, the first light-emitting sub-component 1022A and the second light-emitting sub-component 1022B of the second light-emitting component 1022 may be located on different sides of the another group of opposite sides of the rectangle respectively. Alternatively, the first light-emitting sub-component 1022A and the second light-emitting sub-component 1022B of the second light-emitting component 1022 may also be alternately arranged on each side of the another group of opposite sides of the rectangle, so as to improve the light mixing effect of the second laser beams emitted by the first light-emitting sub-component 1022A and the second light-emitting sub-component 1022B.

In some embodiments, the first light-emitting component 1021 may emit a first laser beam whose center wavelength is within a first wavelength range, and the first light-emitting sub-component 1022A of the second light-emitting component 1022 may emit a first laser sub-beam whose center wavelength is within a second wavelength range, and the second light-emitting sub-component 1022B of the second light-emitting component 1022 may emit a second laser sub-beam whose center wavelength is within the third wavelength range. Wavelengths in the first wavelength range, the second wavelength range and the third wavelength range are different.

It will be noted that, the laser beam emitted by the light-emitting component 102 includes a plurality of wavelengths in a wavelength range. The central wavelength refers to a median of the plurality of wavelengths, or refers to an average value between a minimum wavelength and a maximum wavelength of the plurality of wavelengths.

In some embodiments, the first wavelength range, the second wavelength range, and the third wavelength range correspond to the wavelength ranges of the red laser beam, the green laser beam, and the blue laser beam, respectively. In this case, the first light-emitting component 1021 emits the red laser beam, the first light-emitting sub-component 1022A emits the green laser beam, and the second light-emitting sub-component 1022B emits the blue laser beam.

In the white beams, a ratio of the red laser beams is large, and a ratio of the blue laser beams is equal to a ratio of the green laser beams (e.g., a ratio among the red laser beams, the blue laser beams and the green laser beams may be 2:1:1). Therefore, in some embodiments of the present disclosure, a number of the first light-emitting components 1021 may be equal to a number of the second light-emitting components 1022, the first light-emitting sub-component 1022A of the second light-emitting component 1022 emits the blue laser beam, and the second light-emitting sub-component 1022B emits the green laser beam. A number of the first light-emitting sub-components 1022A is equal to a number of the second light-emitting sub-components 1022B.

Of course, the first wavelength range, the second wavelength range and the third wavelength range may also be other ranges, as long as the laser beams emitted by the first light-emitting component 1021 and the second light-emitting component 1022 may make the laser source 10 obtain the white beams.

In some embodiments, the plurality of light-emitting components 102 of the laser device 100 are laser chips (e.g., semiconductor chips), and the laser chips may emit any one of the red laser beam, the blue laser beam, or the green laser beam.

In some embodiments, the laser device 100 may emit laser beams whose center wavelengths are in different wavelength ranges in a time-division manner, so as to obtain the white laser beams. For example, the first light-emitting component 1021, the first light-emitting sub-component 1022A of the second light-emitting component 1022, and the second light-emitting sub-component 1022B of the second light-emitting component 1022 may sequentially emit the laser beams. In this case, in the laser device 100, electrodes of the first light-emitting components 1021 are connected to each other, electrodes of the first light-emitting sub-components 1022A of the second light-emitting components 1022 are connected to each other, and electrodes of the second light-emitting sub-components 1022B of the second light-emitting components 1022 are connected to each other. It will be noted that the time-division manner refers to different moments.

In a case where the plurality of light-emitting components 102 of the laser device 100 enclose a rectangle, the first light-emitting components 1021 are located on the group of opposite sides of the rectangle, and the first light-emitting sub-components 1022A and the second light-emitting sub-components 1022A of the second light-emitting components 1022 are located on different sides of another group of opposite sides of the rectangle respectively. In this way, the electrodes of the first light-emitting components 1021 are easily connected to each other, the electrodes of the first light-emitting sub-components 1022A are easily connected to each other, and the electrodes of the second light-emitting sub-components 1022B are easily connected to each other.

In some embodiments, for two adjacent light-emitting components 102 whose laser beams have center wavelengths within a same wavelength range, the center wavelengths of the laser beams emitted by the two light-emitting components 102 may be different. The same wavelength range may be any wavelength range among the first wavelength range, the second wavelength range and the third wavelength range.

In some embodiments, the center wavelengths of the laser beams emitted by any two adjacent light-emitting components 102 located on a same side of the rectangle enclosed by the light-emitting components 102 are different. For example, the center wavelengths of the red laser beams emitted by two adjacent light-emitting components 102 that emit the red laser beams are different.

In some embodiments, an absolute value of a difference between the center wavelengths of the laser beams emitted by the any two adjacent light-emitting components 102 may be greater than or equal to a preset threshold. For example, the preset threshold is 1 nm or 2 nm or 3 nm. It will be noted that, the greater the difference between the center wavelengths of the laser beams emitted by two adjacent light-emitting components 102, the less laser beams with a same wavelength in the laser beams emitted by the two light-emitting components 102, thus, the interference phenomenon may be effectively improved.

Generally, in a case where the laser projection apparatus 1 whose laser source 10 includes the laser device 100 is to perform projection display, a speckle effect is usually generated. The speckle effect refers to an effect in which two laser beams emitted by a coherent beam source interfere in space after they scatter by irradiating a rough object (e.g., the screen of the laser projection apparatus 1), and finally a granular bright and dark spot appears on the screen (e.g., a curtain). The speckle effect makes the display effect of the projected image poor, and these bright and dark unfocused spots are in a flickering state in the human eyes, which is prone to dizziness of the human when he or she keep watching for a long time, and the viewing experience of the user will be poor. Therefore, in a case where two adjacent light-emitting components 102 emitting laser beams with a same wavelength and a constant phase difference in the laser device 100 are coherent beam sources, the laser projection apparatus 1 is prone to generate the speckle effect.

However, in some embodiments of the present disclosure, for two adjacent light-emitting components 102 whose laser beams have center wavelengths within a same wavelength range, the center wavelengths of the laser beams emitted by the two adjacent light-emitting components 102 are different, so the two light-emitting components 102 are not coherent beam sources. In this way, it is difficult for the laser beams emitted by the two light-emitting components 102 to interfere with each other, so that it is possible to reduce the speckle effect of the laser projection apparatus 1 whose laser source 10 includes the laser device 100 when performing projection display, the display effect of the projected image in turn is improved, and the feeling of dizziness when viewed by the human eyes is avoided.

In some embodiments, any wavelength of the laser beams emitted by the two adjacent light-emitting components 102, whose laser beams have the center wavelengths within the same wavelength range, is different. For example, a maximum wavelength of the laser beam emitted by one light-emitting component 102 of the two light-emitting components 102 is less than a minimum wavelength of the laser beam emitted by another light-emitting component 102 of the two light-emitting components 102, so that the two light-emitting components 102 are incoherent beam sources, so as to avoid interference of the laser beams emitted by the two light-emitting components 102.

In some embodiments, as shown in FIGS. 11, 12 and 14, the laser device 100 further includes a heat sink 104, and the heat sink 104 corresponds to at least one light-emitting component 102. The light-emitting component 102 is disposed on a side of the heat sink 104 away from the base plate 101, and is mounted on the base plate 101 through the corresponding heat sink 104.

In some embodiments, the heat sink 104 has good heat conductivity, so that heat generated by the light-emitting component 102 may be quickly conducted to the base plate 101 through the heat sink 104 when the light-emitting component 102 emits the laser beam, so as to dissipate heat from the light-emitting component 102.

In some embodiments, the heat sink 104 may be made of at least one of aluminum nitride (AlN) or silicon carbide (SiC).

In some embodiments, as shown in FIGS. 11, 12 and 14, an end of the light-emitting component 102 proximate to the corresponding reflecting prism 103 protrudes from an end of the heat sink 104 proximate to the reflecting prism 103.

It will be noted that, since the laser beam emitted by the light-emitting component 102 has a divergence angle, a portion of the light-emitting component 102 protrudes from the heat sink 104, which may shorten a distance between the light-emitting component 102 and the corresponding reflecting surface 1030 of the reflecting prism 103, and make most of the laser beam radiate on the reflecting prism 103, so that a utilization rate of the laser beam emitted by the light-emitting component 102 may be improved, and thus, the luminance of the laser beams emitted by the laser device 100 may be improved.

Of course, the ends of some light-emitting components 102 of the laser device 100 that are proximate to the corresponding reflecting prism 103 each may be flush with the end of the corresponding heat sink 104 that is proximate to the reflecting prism 103. Alternatively, the ends of at least part of the light-emitting components 102 of the laser device 100 that are proximate to the corresponding reflecting prism 103 each are flush with the end of the corresponding heat sink 104 that is proximate to the reflecting prism 103.

It will be noted that, in a case where the end of the light-emitting component 102 proximate to the corresponding reflecting prism 103 is flush with the end of the heat sink 104 proximate to the reflecting prism 103, an area of the contact portion between the light-emitting component 102 and the heat sink 104 is large, which increases an area of a region of the light-emitting component 102 supported by the heat sink 104, and improves the stability of the light-emitting component 102. Moreover, the heat generated by the light-emitting component 102 may be conducted through the heat sink 104, which improves the heat dissipation effect of the light-emitting component 102.

FIGS. 10 and 11 illustrate by taking an example in which the light-emitting components 102 of the laser device 100 each correspond to a single heat sink 104. Of course, in the laser device 100, a heat sink 104 may also correspond to at least two light-emitting components 102 among the plurality of light-emitting components 102. In this case, an arrangement direction of the at least two light-emitting components 102 is perpendicular to an arrangement direction of the at least two light-emitting components 102 and the corresponding reflecting prism 103, and the at least two light-emitting components 102 are adjacent to each other.

Figure 20:
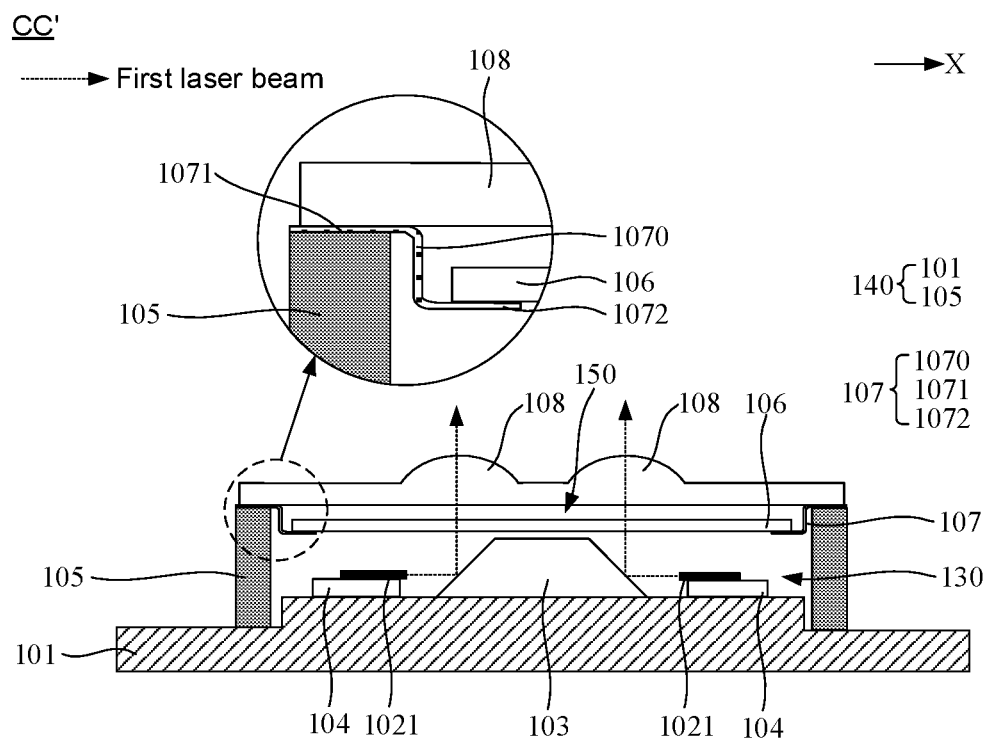
FIG. 20 is a sectional view of the laser device in FIG. 19 taken along the line CC'.

In some embodiments, FIG. 20 is a sectional view of the laser device in FIG. 19 taken along the line CC'. As shown in FIG. 20, the laser device 100 further includes a frame 105 and a light-transmitting layer 106.

The frame 105 is disposed on the base plate 101 and surrounds the plurality of light-emitting components 102. For example, the frame 105 may be an annular shape (e.g., a square ring) and mounted on the base plate 101. Of course, the frame 105 may also be in a shape of a circular ring, a pentagonal ring, or other rings.

The light-transmitting layer 106 is connected to the frame 105 and disposed on a side of the plurality of light-emitting components 102 away from the base plate 101. The light-transmitting layer 106 may be made of a light-transmitting material (e.g., glass or resin).

In some embodiments, a structure composed of the base plate 101 and the frame 105 may be referred to as a tube shell 140 or a base assembly. As shown in FIG. 20, a side of the tube shell 140 away from the base plate 101 is opened, so as to form an opening 150, and the light-transmitting layer 106 is configured to close the opening 150. An accommodating space 130 is provided among the frame 105, the light-transmitting layer 106 and the base plate 101, and the reflecting prism 103 and the plurality of light-emitting components 102 of the laser device 100 are located in the accommodating space 130.

In some embodiments, the accommodating space 130 is filled with noble gases or nitrogen, so as to protect the light-emitting components 102 and prevent the light-emitting components 102 from being oxidized.

It will be noted that, the base plate 101 and the frame 105 of the tube shell 140 may be a single piece or separate pieces. In a case where the base plate 101 and the frame 105 are separate pieces, the base plate 101 and the frame 105 may be connected by means of welding.

In some embodiments, an edge of the light-transmitting layer 106 may be bonded to a surface of the frame 105 away from the base plate 101, or the light-transmitting layer 106 may also be fixed on the frame 105 by other components. For example, as shown in FIG. 20, the laser device 100 further includes a cover plate 107, and the cover plate 107 is disposed at an end of the frame 102 away from the base plate 101. The cover plate 107 may be an annular shape (e.g., a square ring), and the cover plate 107 includes an outer edge region 1071, an inner edge region 1072 and a bending portion 1070. The bending portion 1070 is located between the outer edge region 1071 and the inner edge region 1072. The inner edge region 1072 of the cover plate 107 is recessed toward the base plate 101, and the outer edge region 1071 of the cover plate 107 is fixed on the surface of the frame 105 away from the base plate 101. The light-transmitting layer 106 is located on a side of the inner edge region 1072 of the cover plate 107 away from the base plate 101, and is fixedly connected to the inner edge region 1072. The light-transmitting layer 106 is fixed on the frame 105 through the cover plate 107. In this case, the above accommodating space 130 is provided among the cover plate 107, the light-transmitting layer 106, the frame 105 and the base plate 101.

In some embodiments, as shown in FIG. 20, the laser device 100 further includes a plurality of collimating lenses 108 corresponding to the plurality of light-emitting components 102, and the plurality of collimating lenses 108 are configured to collimate the incident laser beams. The plurality of collimating lenses 108 are located on a surface of the light-transmitting layer 106 away from the base plate 101. The laser beam emitted by the light-emitting component 102 may be incident on the corresponding collimating lens 108 after being reflected by the corresponding reflecting prism 103, and then exit from the laser device 100 after being collimated by the corresponding collimating lens 108.

In some embodiments, as shown in FIG. 20, the plurality of collimating lenses 108 may be a single piece. Alternatively, the plurality of collimating lenses may also be independent of each other.

It will be noted that, FIG. 20 illustrates by taking an example in which the plurality of collimating lenses 108 are located on a side of the light-transmitting layer 106 away from the base plate 101. Of course, the plurality of collimating lenses 108 may also be located in the accommodating space 130.

In some embodiments, the light-emitting component 102 may be electrically connected to an external power supply in a variety of manners.

Figure 21:
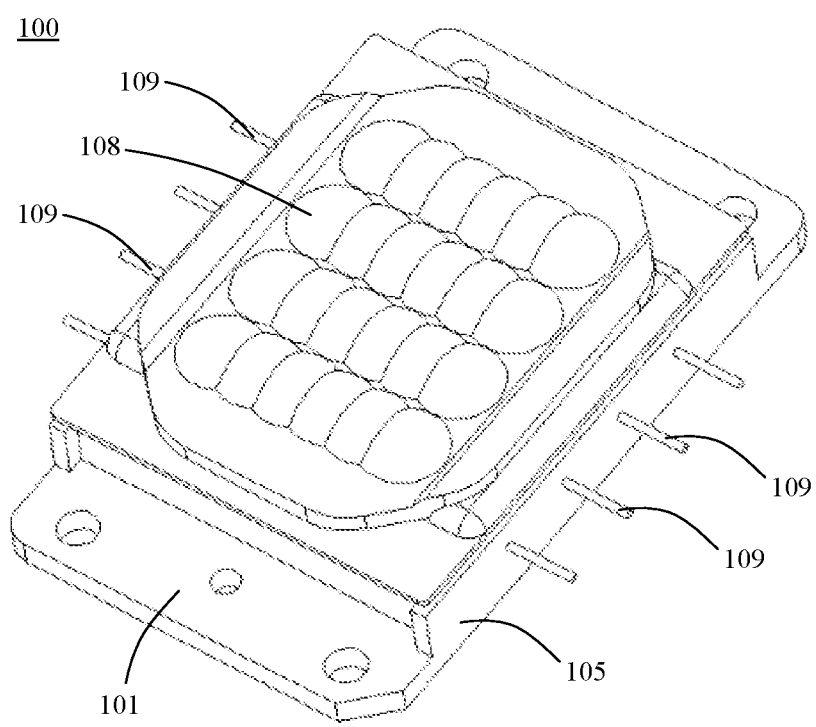
FIG. 21 is a diagram showing a structure of yet another laser device, in accordance with some embodiments.

FIG. 21 is a diagram showing a structure of yet another laser device, in accordance with some embodiments. In some embodiments, as shown in FIG. 21, the laser device 100 further includes a plurality of conductive pins 109, and the plurality of conductive pins 109 are symmetrically distributed on two sides of the frame 105. Portions of the plurality of conductive pins 109 fixed on two sides of the frame 105 that are located outside the frame 105 are electrically connected to the positive and negative electrode of the external power supply. Portions of the plurality of conductive pins 109 extending into the frame 105 each are electrically connected to the electrode of the corresponding light-emitting component 102, so as to transmit an external current to the light-emitting components 102 through the external power supply and excite the light-emitting components 102 to emit the laser beams.

In some embodiments, the conductive pins 109 may be electrically connected to electrodes of the light-emitting components 102 through wires. For example, the conductive pins 109 may be connected to the electrodes of the light-emitting components 102 adjacent to the conductive pins 109 through the wires, and the electrodes of the adjacent light-emitting components 102 that emit laser beams in a same wavelength range may be connected to each other through the wires, so as to transmit external current to each light-emitting component 102.

In some embodiments, a structure composed of the base plate 101, the frame 105 and the conductive pins 109 may also be referred to as the tube shell 140 or the base assembly.

In some embodiments, the laser device 100 further includes a conductive component, and the conductive component is disposed between the light-emitting components 102 and the base plate 101. The electrodes of the light-emitting components 102 are electrically connected to the conductive component, and the conductive component is electrically connected to the external power supply, so as to transmit the external current to the corresponding light-emitting component 102 and excite the corresponding light-emitting component 102 to emit the laser beams.

It will be noted that, some embodiments of the present disclosure are illustrated by taking an example in which the plurality of light-emitting components 102 are connected in series. Of course, the plurality of light-emitting components 102 each may also be electrically connected to the external power supply through the wires.

A person skilled in the art will understand that, the scope of disclosure in the present disclosure is not limited to specific embodiments discussed above, and may modify and substitute some elements of the embodiments without departing from the spirits of this application. The scope of this application is limited by the appended claims.

What is claimed is:

1. A laser projection apparatus, comprising:
a laser source configured to emit illumination beams;
an optical engine configured to modulate the illumination beams emitted by the laser source, so as to obtain projection beams; and
a projection lens configured to project the projection beams into an image;
the laser source including:
a base plate;
a plurality of light-emitting components disposed on the base plate and configured to emit laser beams; and
a reflecting prism disposed on the base plate, the reflecting prism corresponding to at least one of the plurality of light-emitting components, and the reflecting prism being located on a laser-exit side of the at least one light-emitting component; wherein
the plurality of light-emitting components include a first light-emitting component and a second light-emitting component, a polarization direction of a laser beam emitted by the first light-emitting component and a polarization direction of a laser beam emitted by the second light-emitting component being perpendicular to each other, and a laser-exit direction of the first light-emitting component and a laser-exit direction of the second light-emitting component being perpendicular to each other, the polarization direction of the laser beam emitted by one of the first light-emitting component and the second light-emitting component being parallel to the base plate, and the polarization direction of the laser beam emitted by another of the first light-emitting component and the second light-emitting component being perpendicular to the base plate;
the reflecting prism is configured to reflect the laser beams emitted by the light-emitting components in a direction away from the base plate, and change a polarization polarity of one of the laser beam with the polarization direction perpendicular to the base plate or the laser beam with the polarization direction parallel to the base plate, so as to make the polarization directions of the laser beams reflected by the reflecting prism same; and
the laser beams exiting from the laser source in the direction away from the base plate constitute the illumination beams.

2. The laser projection apparatus according to claim 1, wherein
the reflecting prism is configured to change the polarization polarity of the laser beam whose polarization direction is perpendicular to the base plate by 90°, and keep the polarization polarity of the laser beam whose polarization direction is parallel to the base plate unchanged; and
the laser beams reflected by the reflecting prism exit in a direction perpendicular to the base plate.

3. The laser projection apparatus according to claim 2, wherein
the base plate includes a first region and a second region surrounding the first region; and
the reflecting prism is located in the first region of the base plate, and the plurality of light-emitting components are located in the second region of the base plate.

4. The laser projection apparatus according to claim 3, wherein
the reflecting prism includes a reflecting surface, the reflecting surface is a surface of the reflecting prism opposite to the at least one light-emitting component, and the reflecting surface is configured to reflect the laser beams emitted by the light-emitting components in the direction away from the base plate.

5. The laser projection apparatus according to claim 4, wherein the laser source includes a plurality of reflecting prisms, and the plurality of reflecting prisms correspond to the plurality of light-emitting components.

6. The laser projection apparatus according to claim 5, wherein the first light-emitting components are located on two sides of the first region in a first direction, and the second light-emitting components are located on two sides of the first region in a second direction perpendicular to the first direction.

7. The laser projection apparatus according to claim 6, wherein
the second light-emitting component includes a first light-emitting sub-component and a second light-emitting sub-component; and
the first light-emitting sub-component and the second light-emitting sub-component of the second light-emitting component are located on different sides of the two sides of the first region respectively; or, the first light-emitting sub-component and the second light-emitting sub-component of the second light-emitting component are alternately arranged on a same side of the two sides of the first region.

8. The laser projection apparatus according to claim 6, wherein
two or more light-emitting components of the plurality of light-emitting components located on a same side of the first region are arranged in the first direction or the second direction.

9. The laser projection apparatus according to claim 4, wherein the reflecting prism corresponds to at least two adjacent light-emitting components of the plurality of light-emitting components, and the at least two light-emitting components are located on a same side of the corresponding reflecting prism; or the reflecting prism corresponds to at least two of the plurality of light-emitting components, and the at least two light-emitting components are located on different sides of the corresponding reflecting prism.

10. The laser projection apparatus according to claim 9, wherein the laser source includes a plurality of reflecting prisms, and two or more adjacent light-emitting components of the plurality of light-emitting components correspond to a same reflecting prism.

11. The laser projection apparatus according to claim 9, wherein the laser source includes a reflecting prism corresponding to the plurality of light-emitting components, and the reflecting prism including at least two reflecting surfaces.

12. The laser projection apparatus according to claim 9, wherein the first light-emitting components are located on two sides of the first region in a first direction, and the second light-emitting components are located on two sides of the first region in a second direction perpendicular to the first direction.

13. The laser projection apparatus according to claim 12, wherein
the second light-emitting component includes a first light-emitting sub-component and a second light-emitting sub-component; and
the first light-emitting sub-component and the second light-emitting sub-component of the second light-emitting component are located on different sides of the two sides of the first region respectively; or, the first light-emitting sub-component and the second light-emitting sub-component of the second light-emitting component are alternately arranged on a same side of the two sides of the first region.

14. The laser projection apparatus according to claim 12, wherein
two or more light-emitting components of the plurality of light-emitting components located on a same side of the first region are arranged in the first direction or the second direction.

15. The laser projection apparatus according to claim 2, wherein
the second light-emitting component includes a first light-emitting sub-component and a second light-emitting sub-component;
the first light-emitting component is configured to emit a first laser beam whose center wavelength is within a first wavelength range, and the first light-emitting sub-component of the second light-emitting component is configured to emit a first laser sub-beam whose center wavelength is within a second wavelength range, and the second light-emitting sub-component of the second light-emitting component is configured to emit a second laser sub-beam whose center wavelength is within a third wavelength range; and
the center wavelength is a median of a plurality of wavelengths of the laser beam emitted by one light-emitting component of the plurality of light-emitting components, or an average value between a minimum wavelength and a maximum wavelength of the laser beam emitted by the one light-emitting component.

16. The laser projection apparatus according to claim 15, wherein in the light-emitting components whose laser beams have center wavelengths within a same wavelength range, the central wavelengths of the laser beams emitted by any two adjacent light-emitting components are different.

17. The laser projection apparatus according to claim 16, wherein an absolute value of a difference between the center wavelengths of the laser beams emitted by the any two adjacent light-emitting components is greater than or equal to a preset threshold.

18. The laser projection apparatus according to claim 15, wherein in the light-emitting components whose laser beams have center wavelengths within a same wavelength range, wavelengths of the laser beams emitted by two adjacent light-emitting components are different.

19. The laser projection apparatus according to claim 15, wherein the first light-emitting component emits a red laser beam, and the first light-emitting sub-component of the second light-emitting component emits one of a green laser beam and a blue laser beam, and the second light-emitting sub-component of the second light-emitting component emits another of the green laser beam and the blue laser beam.

20. The laser projection apparatus according to claim 1, wherein the laser source further includes:
a frame disposed on the base plate and surrounding the plurality of light-emitting components; and
a light-transmitting layer connected to the frame and disposed on a side of the plurality of light-emitting components away from the base plate, and an accommodating space being provided among the base plate, the frame and the light-transmitting layer, the reflecting prism and the plurality of light-emitting components being located in the accommodating space.

* * * * *

UNITED STATES PATENT AND TRADEMARK OFFICE
CERTIFICATE OF CORRECTION

Page 1 of 1

PATENT NO. : 12,238,461 B2
APPLICATION NO. : 17/943608
DATED : February 25, 2025
INVENTOR(S) : Youliang Tian et al.

It is certified that error appears in the above-identified patent and that said Letters Patent is hereby corrected as shown below:

On the Title Page

Column 1, Item (73), replace the present listing with the following:
--(73) HISENSE LASER DISPLAY CO., LTD, Qingdao (CN)--

Signed and Sealed this
Twenty-second Day of April, 2025

Coke Morgan Stewart
*Acting Director of the United States Patent and Trademark Office*